United States Patent
Larson (10) Patent No.: US 10,636,599 B2
(45) Date of Patent: Apr. 28, 2020

(54) MULTIFUNCTION WIRELESS RELAY

(71) Applicant: Littelfuse, Inc., Chicago, IL (US)

(72) Inventor: Kip M. Larson, Rapid City, SD (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 15/829,513

(22) Filed: Dec. 1, 2017

(65) Prior Publication Data

US 2018/0166239 A1     Jun. 14, 2018

Related U.S. Application Data

(60) Provisional application No. 62/434,081, filed on Dec. 14, 2016.

(51) Int. Cl.

| | | |
|---|---|---|
| *H01H 45/00* | (2006.01) | |
| *H01H 47/00* | (2006.01) | |
| *H05K 7/14* | (2006.01) | |
| *H05K 1/14* | (2006.01) | |
| *H02H 7/08* | (2006.01) | |
| *H04B 7/15* | (2006.01) | |
| *H04B 7/155* | (2006.01) | |
| *H02H 3/00* | (2006.01) | |
| *H02H 1/00* | (2006.01) | |

(52) U.S. Cl.
CPC ........ *H01H 47/001* (2013.01); *H02H 1/0061* (2013.01); *H02H 3/006* (2013.01); *H02H 7/0833* (2013.01); *H04B 7/15* (2013.01); *H04B 7/15557* (2013.01); *H05K 1/148* (2013.01); *H05K 7/1427* (2013.01); *H02H 7/08* (2013.01); *H05K 1/144* (2013.01); *H05K 2201/042* (2013.01); *H05K 2201/10159* (2013.01); *H05K 2201/10363* (2013.01)

(58) Field of Classification Search
CPC ...... H05K 5/0247; H05K 5/03; H05K 1/0298; H05K 1/11; H05K 1/18; H05K 1/181
USPC .......................................... 455/74, 78, 550.1
See application file for complete search history.

(56) References Cited

U.S. PATENT DOCUMENTS

| | | | |
|---|---|---|---|
| 2005/0012640 A1 | 1/2005 | Kong et al. | |
| 2007/0252562 A1 | 11/2007 | Montanya | |
| 2008/0122575 A1* | 5/2008 | Lavian ..................... | G05B 9/02 340/3.1 |
| 2013/0169345 A1 | 7/2013 | Bauer | |
| 2013/0203365 A1 | 8/2013 | Tieman | |
| 2014/0176840 A1* | 6/2014 | Hashido .............. | G02F 1/13306 349/33 |
| 2015/0170860 A1* | 6/2015 | Ahmed ................ | H01H 47/001 361/187 |
| 2017/0053762 A1* | 2/2017 | King ..................... | G05B 15/02 |

OTHER PUBLICATIONS

International Search Report for the International Patent Application No. PCT/US2017/064280, dated Feb. 23, 2018.
International Preliminary Report on Patentability for the International Patent Application No. PCT/US2017/064280 dated Jun. 27, 2019, 8 pages.

* cited by examiner

*Primary Examiner* — Tu X Nguyen (57) ABSTRACT

A wireless relay may include a housing; an output, disposed within the housing; and a wireless interface, disposed within the housing, wherein the wireless interface is to receive wireless communication signals including settings to configure one or more functionalities associated with the wireless relay.

9 Claims, 5 Drawing Sheets

MULTIFUNCTION WIRELESS RELAY

RELATED APPLICATIONS

This Application claims priority to U.S. Provisional Patent Application No. 62/434,081, entitled, WIRELESS COMMUNICATION ENABLED RELAY, filed Dec. 14, 2016, and incorporated by reference herein in its entirety.

BACKGROUND

Field

The present disclosure generally relates to a relay. More particularly, the present disclosure generally relates to a relay that is enabled for radio frequency communication, such as Bluetooth wireless communication.

Description of Related Art

Relays are required to perform a variety of different functions depending on the applications for which they are employed. For example, some relays preform various timing functions. In one example, a relay commences timing when an initiate contact is closed and have an off output during timing. In another example, a relay commences timing when an initiate contact is open and have an on output during timing. In yet another example, a type of relay has an output that switches between an off and on state during timing. Furthermore, relays are adapted for use in all different classes of electrical circuits including low voltage DC, high voltage DC, low voltage AC, and high voltage AC.

One type of protection relay is a motor protection relay, where motor protection relays are generally used to provide such monitoring and protection functions. Motors are widely used throughout industry to transform electrical energy into mechanical energy that may be used to perform work. Motors are often necessary pieces of equipment for performing numerous industrial tasks. Because motors are such an integral part of many industries, loss of use of a motor can cause significant delays and loss of income while the motor is off-line. Therefore, motors are often monitored and protected against overload conditions, ground faults, and the like.

In addition, relays may have different time delay functions and settings. Some relays have fixed time delays while other relays have adjustable time delays. Relays that have adjustable time delays have specified timing ranges while relays that have fixed time delays have specified time delays.

Manufacturers have addressed the need for relays having various timer functions, voltage ratings, time delay functions, and timing settings by making available to users a wide variety of different uniquely configured relays. These uniquely configured relays have different combinations of circuit elements for each model. Moreover, because of the large number of possible combinations of functions, ratings, and settings, manufacturers must design and produce a large number of different relays to satisfy the needs of its users, each of the relays having a unique combination of circuit elements. Manufacturing a large number of unique circuits results in high engineering costs and high manufacturing costs.

Furthermore, these uniquely configured relays often include numerous physical interfaces, such as adjustment knobs, that require adjustment before the relays are used in the field and/or while the relays are deployed in the field. The programming and configuration interfaces physically located on conventional relays have a number of drawbacks. For example, adjusting or modifying programming and configuration interfaces located on the conventional relays necessarily requires a user or technician to physically access the relays. This requirement to physically access the relays to make adjustments and configuration settings is intrinsically time-consuming. Furthermore, physically accessing the relays to make adjustments and configuration settings when the relays are deployed in the field may expose the user or technician to unnecessary safety hazards. Such safety hazards include exposure to high voltages, arc flashes, and the like, which may be present in environments where conventional relays are deployed. Furthermore, physical interfaces on the conventional relays may be subject to failure due to mechanical abuse, moisture, and other forms of contamination. Therefore, an improved programming and configuration interface for relays is needed.

Other problems with conventional relays will become apparent in view of the disclosure below.

SUMMARY

This Summary is provided to introduce a selection of concepts in a simplified form further described below in the Detailed Description. This Summary is not intended to identify key or essential features of the claimed subject matter, nor is this Summary intended as an aid in determining the scope of the claimed subject matter.

In one embodiment, a wireless relay may include a housing; an output, disposed within the housing; and a wireless interface, disposed within the housing, wherein the wireless interface is to receive wireless communication signals including settings to configure one or more functionalities associated with the protection relay.

In another embodiment, a multifunction wireless relay may include a housing and an output disposed within the housing. The multifunction wireless relay may also include a processor, disposed within the housing and coupled to the output; and an antenna, coupled to the processor, wherein the antenna enables wireless connectivity to program functionality of the multifunction wireless relay.

In a further embodiment, a wireless relay may include a housing; an output, disposed within the housing; and a wireless communications interface, coupled to the output and disposed within the housing, the wireless communication interface adapted to receive wireless communication signals for configuring operating parameters of the protection relay via the processor, wherein the wireless relay is devoid of a physical user interface located within, or on an exterior of, the housing.

In another embodiment, a protection relay may include a housing and a printed circuit board disposed within the housing. The printed circuit board may include a processor and a wireless communication interface, the wireless communication interface adapted to receive wireless communication signals for configuring operating parameters of the protection relay via the processor, wherein the protection relay is devoid of a physical user interface located within, or on an exterior of, the housing.

DETAILED DESCRIPTION

The present embodiments provide enhanced relays, such as multifunction relays, protection relays, including motor protection relays, where operation of the relays is enhanced via a wireless interface.

Figure 1:
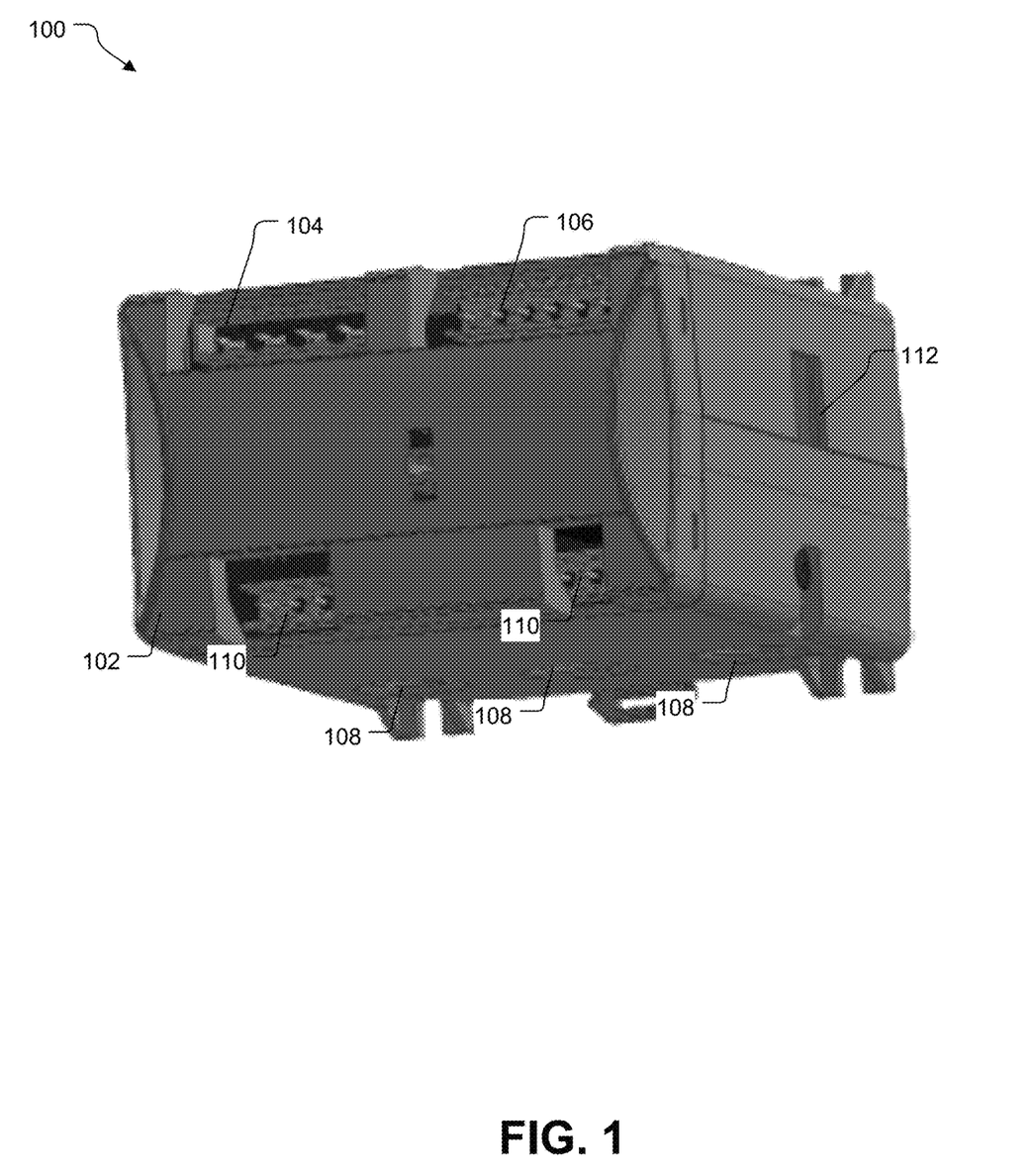
FIG. 1 illustrates a motor protection relay, according to an embodiment of the disclosure.

FIG. 1 illustrates a motor protection relay 100 according to an embodiment of the disclosure. The motor protection relay 100 includes a housing 102. The housing 102 includes a plurality of voltage inputs 104. A motor (not illustrated) may be coupled to the motor protection relay 100 using one or more of the voltage inputs 104. The housing 102 of the motor protection relay 100 includes one or more outputs 106. The outputs 106 may include, for example, alarm outputs for indicating a fault associated with a motor coupled to the motor protection relay 100. The motor protection relay 100 may further include one or more integrated current transformers 108. The motor protection relay 100 may include one or more additional inputs and outputs 110. Such one or more additional inputs and outputs 110 may include, for example, auxiliary programmable inputs for the motor protection relay 100, zero-sequence ground fault current transformer connectivity for direct or resistive grounded power systems, and/or network coupling for input output devices, displays, and the like. Furthermore, the motor protection relay 100 may include an Ethernet port 112. The Ethernet port 112 enables a wired coupling of a computing device to the motor protection relay 100 for the purpose of data acquisition, control, or programming of various set points associated with the motor protection relay 100.

Unlike conventional motor protection relays, the motor protection relay 100 does not include a physical configuration interface on the housing 102. Rather, as will be described in the following, the motor protection relay 100 may be monitored, controlled or programmed using a computing device, such as a tablet computer or mobile phone, wirelessly coupled to the motor protection relay 100. To that end, internal components of the motor protection relay 100 may enable wireless connectivity to external computing devices. Such wireless connectivity functionality associated with the motor protection relay 100 may include Bluetooth, Wi-Fi, ZigBee, near field wireless communication protocols, or other short range, medium-range or long-range wireless connectivity functionality.

Figure 2:
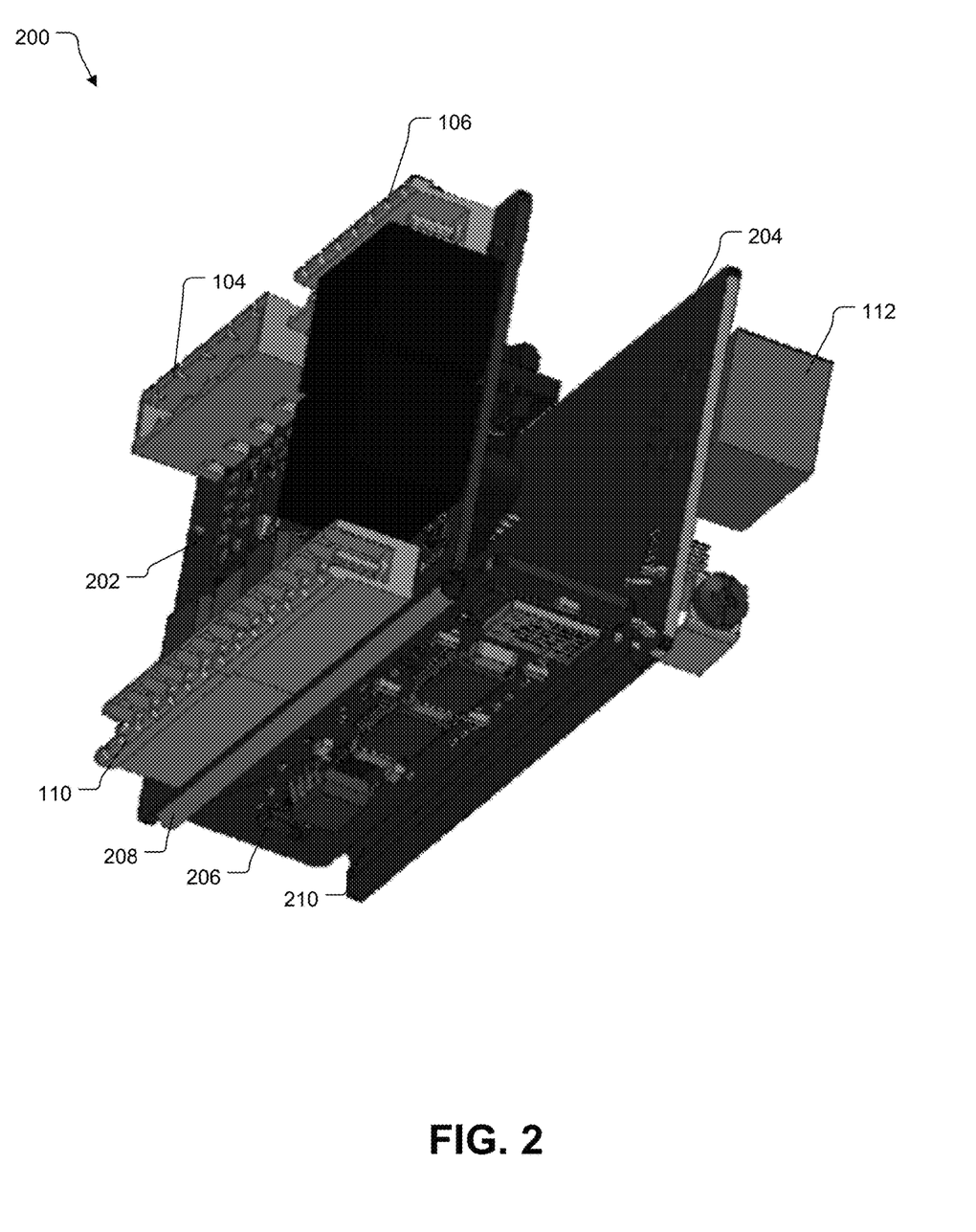
FIG. 2 illustrates a printed circuit board that may be housed within a housing of the motor protection relay, according to an embodiment of the disclosure.

FIG. 2 illustrates a printed circuit board 200 that may be housed within the housing 102 of the motor protection relay 100, according to an embodiment of the disclosure. The printed circuit board 200 includes a first printed circuit board section 202, a second printed circuit board section 204, and a third printed circuit board section 206. The printed circuit board 200 further includes a first flexible interconnect element 208 that couples the first printed circuit board section 202 to the third printed circuit board section 206. Additionally, a second flexible interconnect element 210 is included that couples the second printed circuit board section 204 to the third printed circuit board section 206. The first flexible interconnect element 208 may include one or more wired connections that enable bidirectional communication between the first printed circuit board section 202 and the third printed circuit board section 206. Similarly, the second flexible interconnect element 210 may include one or more wired connections that enable bidirectional communication between the second printed circuit board section 204 and the third printed circuit board section 206. In an alternative embodiment, the printed circuit board 200 includes two rigid printed board sections that are coupled together using a flexible interconnect element.

The printed circuit board 200 may be configured in a compact arrangement, as is illustrated in FIG. 2. Specifically, the first flexible interconnect element 208 and the second flexible interconnect element 210 allow the folding of the printed circuit board 200 in the illustrated compact arrangement. Advantageously, this compact arrangement of the printed circuit board 200 provides a streamlined design that reduces a size of the housing 102 compared to a size of a housing that would be required to house a single rigid printed circuit board, or multiple rigid printed circuit boards in a stacked arrangement.

Figure 3:
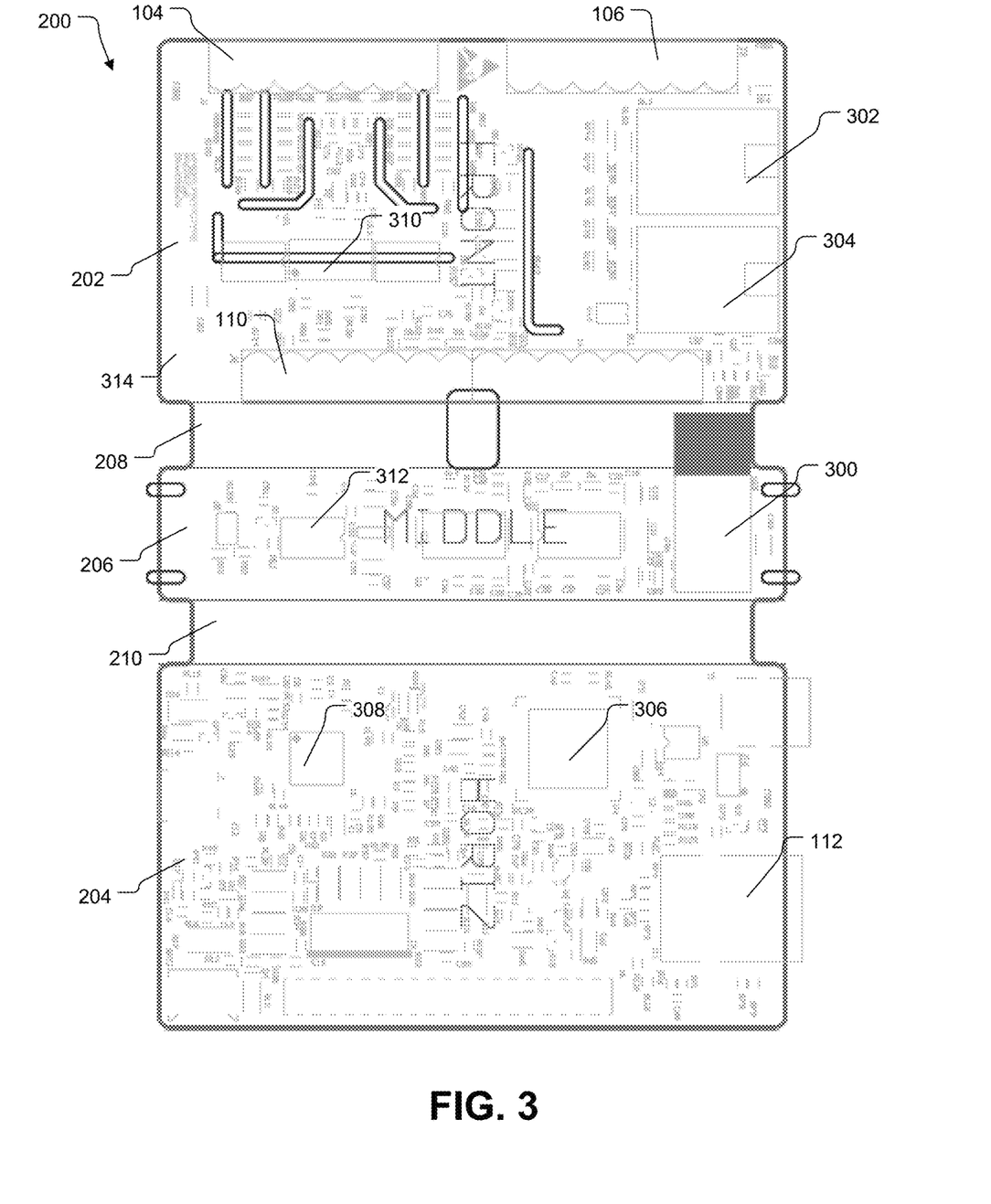
FIG. 3 illustrates an exemplary view of the printed circuit board, according to an embodiment of the disclosure.

FIG. 3 illustrates an exemplary view of the printed circuit board 200, according to an embodiment of the disclosure. In particular, in FIG. 3, the printed circuit board 200 is illustrated in an extended or generally horizontal arrangement. The extended or generally horizontal arrangement of the printed circuit board 200 is made possible at least in part by the first flexible interconnect element 208 and second flexible interconnect element 210.

As is illustrated, the printed circuit board 200 includes a wireless radio frequency module 300. The wireless radio frequency module 300 may include wireless protocol functionality enabling Bluetooth, Wi-Fi, ZigBee, near field wireless communication protocols, and/or other short range, medium-range or long-range wireless connectivity functionality. In one embodiment, the wireless radio frequency module 300 accommodates wireless connectivity to a computing device, such as a tablet computer or mobile phone. Such wireless connectivity via the wireless radio frequency module 300 enables configuration of the motor protection relay 100 via a wireless connection established between a computing device and the motor protection relay 100. For example, by way the wireless radio frequency module 300, a computing device may be used to configure motor protection settings of the motor protection relay 100. Such settings may include, but are not limited to, inverse or instantaneous phase overcurrent protection settings, phase to phase protection settings, phase unbalance protection settings, ground fault protection settings, motor jam protection settings, underload or under power protection settings, off-nominal frequency protection settings, out of phase sequence condition settings, motor backspin settings, emergency motor override settings, current transformer settings, and the like.

The printed circuit board 200 may include various additional electronic components disposed thereon. For example, the printed circuit board 200 may include a first output relay 302 and a second output relay 304. Furthermore, a central processing unit 306 may be disposed on the printed circuit board 200. The central processing unit 306 may be used to enable various functionalities associated with the motor protection relay 100. In particular, the central processing unit 306 may execute a sequence of stored instructions to enable the various functionalities associated with the motor protection relay 100. In a particular implementation, the central processing unit 306 processes wireless communication signals of the wireless radio frequency module 300. Those wireless communication signals may include settings used to configure the motor protection relay 100. The settings may be wirelessly transmitted from an external computer device and received by the wireless radio frequency module 300. An analog-to-digital converter 308 is provided for mixed signal functions of components disposed on the printed circuit board 200. Furthermore, DC to DC converters 310 and 312 are provided to handle DC voltage level conversions.

A conformal coating 314 may be applied over or to cover the printed circuit board 200 and the electrical components disposed thereon. In one embodiment, the conformal coating 314 is a polymeric film that covers a surface of the printed circuit board 200 as well as the components disposed on the printed circuit board 200. The conformal coating 314 is advantageously used to protect the printed circuit board 200 and the components disposed thereon from undesirable external influences, such as water, chemicals, undesirable conductive contamination, and the like. It should be noted here that printed circuit boards associated with a conventional motor protection relays are unable to accommodate such a conformal coating. Specifically, use of a conformal coating is generally not possible because of the programming and configuration interface physically located on conventional motor protection relays. Such a physical configuration interface requires multiple coupling points to the printed circuit boards, which makes applying a conformal coating to the printed circuit boards impracticable.

Figure 4:
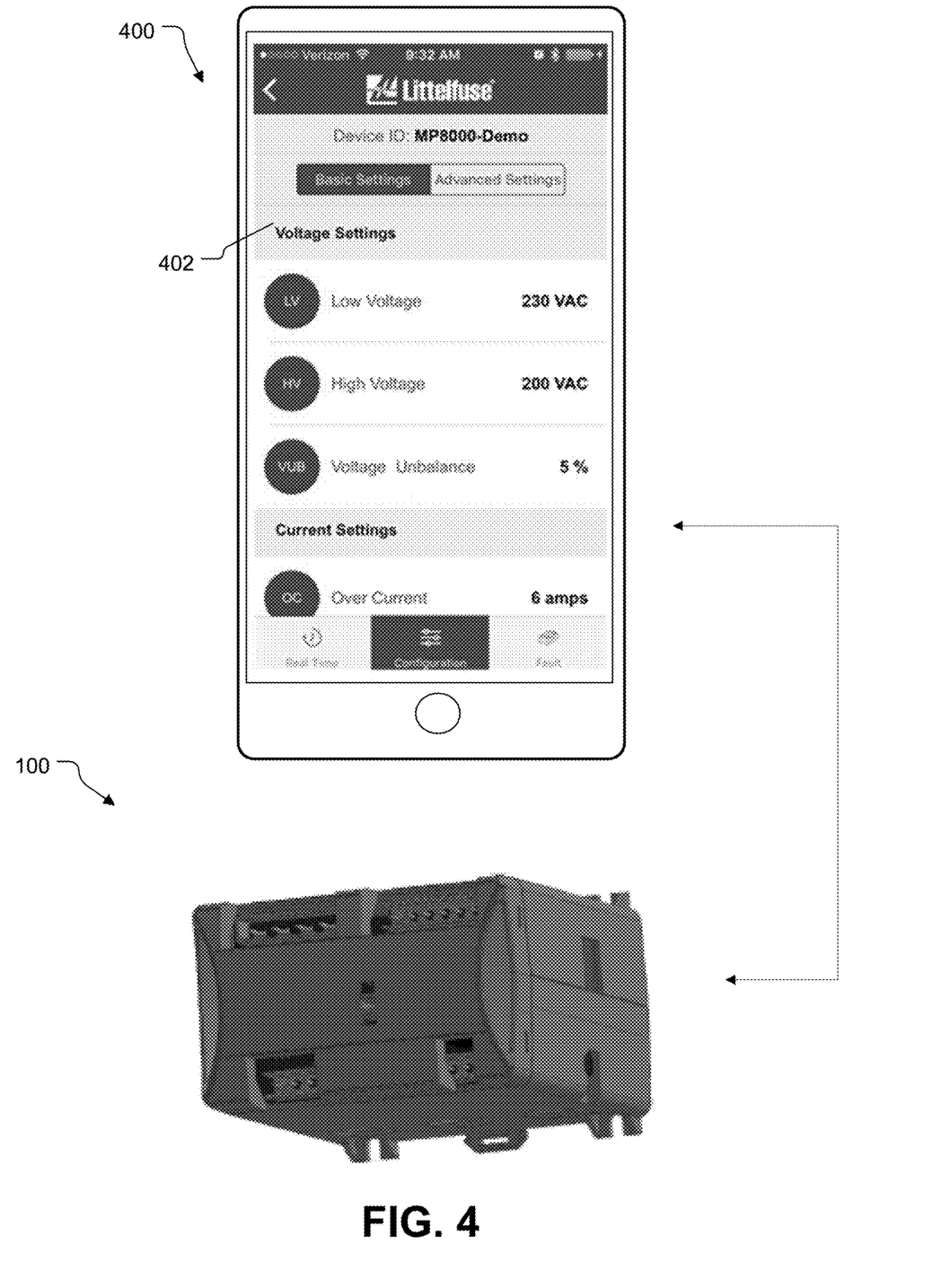
FIG. 4 illustrates an exemplary computing device wirelessly communicating with the motor protection relay, according to an embodiment of the disclosure.

FIG. 4 illustrates an exemplary computing device 400 wirelessly communicating with the motor protection relay 100. As illustrated, the exemplary computing device 400 includes a configuration interface 402. The configuration interface 402 may be used to configure settings associated with the motor protection relay 100. In one exemplary embodiment, the configuration interface 402 may be used configure voltage settings, current settings, inverse or instantaneous phase overcurrent protection settings, phase to phase protection settings, phase unbalance protection settings, ground fault protection settings, motor jam protection settings, underload or under power protection settings, off-nominal frequency protection settings, out of phase sequence condition settings, motor backspin settings, emergency motor override settings, current transformer settings, and the like, which are configurable in the motor protection relay 100.

Figure 5:
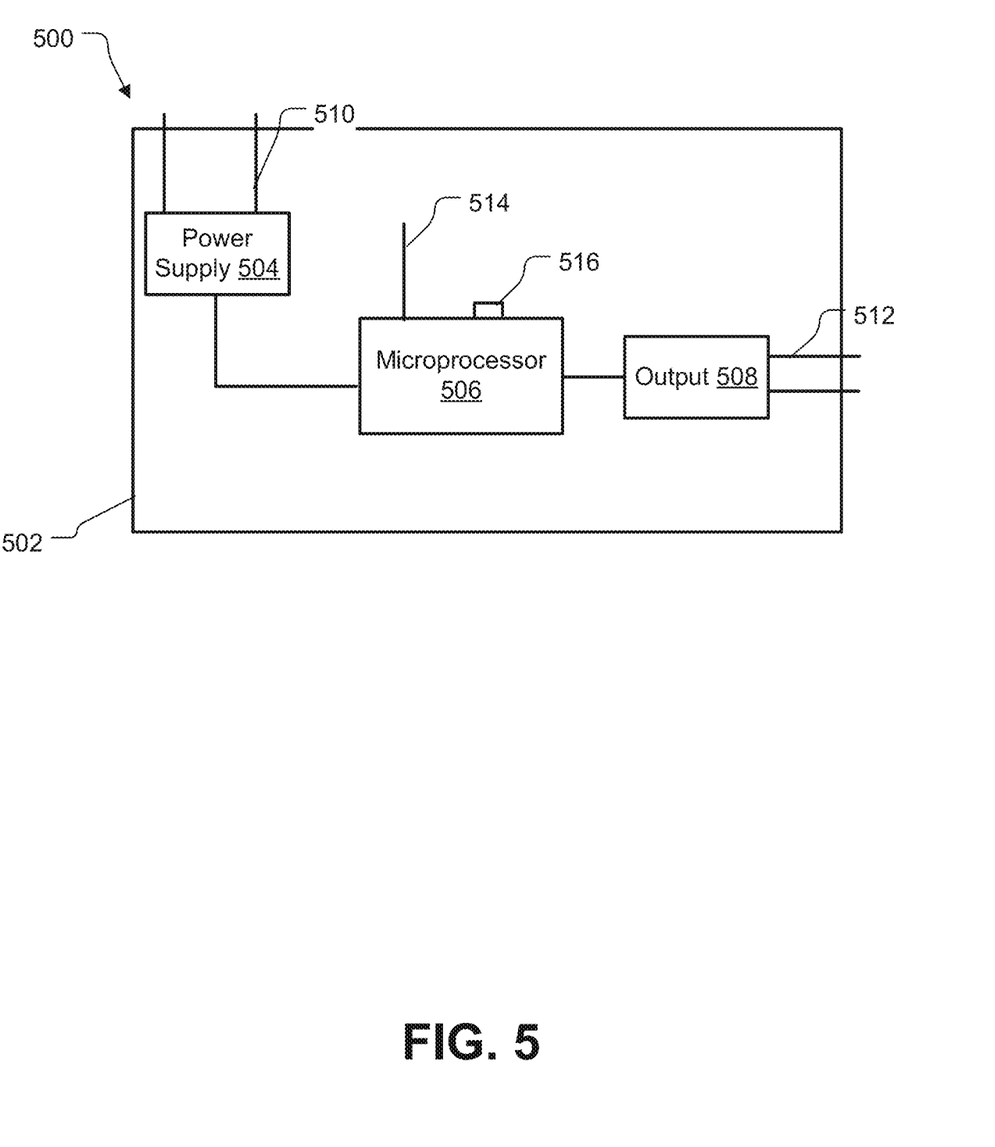
FIG. 5 illustrates a relay according to an embodiment of the disclosure.

FIG. 5 illustrates a relay 500 according to an embodiment of the disclosure. In one implementation, the relay 500 is a multifunction relay. For example, the relay 500 may be a time delay relay that includes selectable single and dual functions. As will be described in the following, the relay 500 may receive configuration and programming settings via a wireless connection, such as via Bluetooth, infrared, ZigBee, near field wireless communication protocols, or other short range, medium-range or long-range wireless connection. Therefore, unlike the conventional relays, the requirement to include switches, potentiometers or other mechanical hardware on an exterior housing of the relay 500 is eliminated.

The relay 500 may include a housing 502. The housing 502 may include a power supply 504, a microprocessor 506 and an output stage 508. The power supply 504 may include one or more leads or input ports 510 that are accessible from an exterior of the housing 502. The input ports 510 may couple to a power source. The power supply 504 may be functional to convert a voltage supplied by the power source. For example, the power supply 504 may convert an AC voltage to a DC voltage.

The output stage 508 may include one or more leads or output ports 512. In one implementation, the output ports 512 are in the form of a pin octal socket. For example, the output ports 512 may be associated with an 8 or 11 pin octal socket.

The microprocessor 506 may be coupled to an antenna 514. The antenna 514 enables wireless connectivity to a device that may be used to program the functionality of the relay 500. The wireless connectivity compatible with the microprocessor 506 includes Bluetooth, infrared, ZigBee, near field wireless communication protocols, or other short range, medium-range or long-range wireless connection. In various embodiments the microprocessor 506 may include a wireless module, as generally described above, or may be coupled to a wireless module, where the microprocessor 506, wireless module, and antenna 514 enable wireless communications to receive instructions for programming functionality of the relay 500. More generally, a wireless interface may be distributed within one or more components, including general processors, wireless chips, and so forth, to provide wireless functionality to a relay, such as relay 500, including one or more wireless communications protocols, as known in the art. For example, a central processor, and a communications processor used for wireless communications (and optionally an antenna) may be incorporated in a common chip (semiconductor die), acting as a wireless interface. Thus, the microprocessor 506 and antenna 514 may constitute a wireless interface in some embodiments.

In various embodiments, a disable component may be provided to allow disabling as well as enabling of wireless communications to and from a relay, such as motor protection relay 100 or relay 500. In one implementation, as shown in FIG. 5, a mechanical switch or jumper 516 associated with the microprocessor 506 is provided as a disable component. The jumper 516 may be located on a printed circuit board on which the microprocessor 506 is mounted. The jumper 516 may be used to disable the antenna 514 via the microprocessor 506. More particularly, in one implementation, when the jumper 516 is in place, the microprocessor 506 is configured to allow for wireless communication via the antenna 514. Notably, when the jumper 516 is removed, the microprocessor 506 is hardware and/or software configured without wireless communication functionality. Specifically, when the jumper 516 is removed, the antenna 514 and microprocessor 506 are unable to wirelessly configure the relay 500.

In one example, the relay 500 is wirelessly configured at the time of manufacture. Subsequently, the jumper 516 is removed to disconnect the antenna 514 from microprocessor 506. This process of removing the jumper 516 removes the possibility of programming the relay 500 after manufacture.

In another example, the relay 500 is wirelessly configured at the time manufacture, and the jumper 516 is left in place thereafter. Therefore, the wireless programming of the relay 500 after manufacture is retained, so that the relay 500 may be programmed in the field.

Although the jumper 516 is shown as providing the functionality to enable or disable the wireless configurability functions of the relay 500, it is to be recognized that the relay 500 may implement other technology for use as a disable component to enable or disable the wireless configurability functions to the relay 500. For example, rather than the use of the jumper 516, the microprocessor 506 may be programmed to receive a predetermined code that enables or disables the wireless configurability functions of the relay 500. Thus, the enable device in this case may be a code or other stored information, where such stored information may be stored in a memory located within microprocessor 506 or coupled to microprocessor 506.

The relay 500 may receive a vast number configuration instructions wirelessly via the antenna 514. In general, these configuration instructions configure the microprocessor to provide certain functionalities to the relay 500. The configuration instructions may include, for example, delay on functions, such as delay on make and delay on operate; interval on; off delay, such as delay on release, delay on break, delay on deenergization; single shot, such as one-shot momentary interval; flasher, such as off a first are on first; on/off delay; single shot falling edge; watchdog, such a retriggerable single shot; triggered on delay; repeat cycle, such as off first or on first; delayed interval; triggered delayed interval; true off delay; on delay/true off delay; single shot-flasher; and/or on delay-flasher.

In a similar fashion as illustrated in FIG. 4, the relay 500 may be programmed using a configuration interface on a computing device, tablet computer, and/or mobile device.

While devices and methods associated with motor protection relays and general relays have been described with reference to certain embodiments, it will be understood by those skilled in the art that various changes may be made and equivalents may be substituted without departing from the spirit and scope of the claims of the application. Other modifications may be made to adapt a particular situation or material to the teachings disclosed above without departing from the scope of the claims. Therefore, the claims should not be construed as being limited to any one of the particular embodiments disclosed, but to any embodiments that fall within the scope of the claims.

I claim:

1. A wireless relay, comprising:
   a housing;
   an output, disposed within the housing;
   a wireless interface, disposed within the housing, wherein the wireless interface is to receive wireless communication signals including settings to configure one or more functionalities associated with the wireless relay; and
   a printed circuit board, wherein the wireless interface comprises a processor and an antenna, the wireless interface being coupled to the printed circuit board, wherein the printed circuit board comprises:
   a first printed circuit board section;
   a second printed circuit board section; and
   a flexible connector, wherein the first printed circuit board section is coupled to the second printed circuit board section via the flexible connector, wherein at least one of: a central processing unit, analog to digital converter, and DC to DC converter is disposed on the printed circuit board;
   a memory coupled to the printed circuit board; and
   a disable component comprising a code stored within the memory;
   wherein the processor is configured to disable or enable wireless configurability functions of the wireless relay without disabling or enabling the wireless relay based upon receipt of the code.

2. The wireless relay, according to claim 1, wherein the wireless interface is enabled to receive Bluetooth, Wi-Fi, or ZigBee, wireless signals, or any combination thereof.

3. The wireless relay according to claim 1, wherein the settings include voltage settings, current settings, instantaneous phase overcurrent protection settings, phase to phase protection settings, phase unbalance protection settings, ground fault protection settings, motor jam protection settings, underload or under power protection settings, off-nominal frequency protection settings, out of phase sequence condition settings, motor backspin settings, emergency motor override settings, or current transformer settings.

4. The wireless relay of claim 1, further comprising: an analog-to-digital converter and at least one DC to DC converter, disposed on the printed circuit board.

5. A multifunction wireless relay, comprising:
   a housing;
   an output disposed within the housing;
   a processor, disposed within the housing and coupled to the output;
   an antenna, coupled to the processor, wherein the antenna enables wireless connectivity to program functionality of the multifunction wireless relay; and
   a printed circuit board disposed in the housing, the printed circuit board including the processor, the antenna, and the output, and further comprising:
   a first printed circuit board section;
   a second printed circuit board section; and
   a flexible connector, wherein the first printed circuit board section is coupled to the second printed circuit board section via the flexible connector, wherein at least one of: a central processing unit, analog to digital converter, and DC to DC converter is disposed on the printed circuit board;
   a memory, coupled to the printed circuit board; and
   a disable component comprising a code stored within the memory, wherein the processor is configured to disable or enable wireless configurability functions of the wireless relay without disabling or enabling the wireless relay based upon receipt of the code.

6. The multifunction wireless relay according to claim 5, wherein the processor and antenna form a wireless interface, wherein the wireless interface is enabled to receive Bluetooth, Wi-Fi, or ZigBee, wireless signals, or any combination thereof.

7. The multifunction wireless relay according to claim 5, wherein the functionality includes voltage settings, current settings, inverse or instantaneous phase overcurrent protection settings, phase to phase protection settings, phase unbalance protection settings, ground fault protection settings, motor jam protection settings, underload or under power protection settings, off-nominal frequency protection settings, out of phase sequence condition settings, motor backspin settings, emergency motor override settings, or current transformer settings.

8. A wireless relay comprising:
   a housing;
   an output, disposed within the housing;
   a wireless communications interface, coupled to the output and disposed within the housing, the wireless communication interface adapted to receive wireless communication signals for configuring operating parameters of the protection relay via a processor,
   wherein the wireless relay is devoid of a physical user interface located within, or on an exterior of, the housing; and
   a printed circuit board disposed in the housing, the printed circuit board including the processor, the wireless communications interface, and the output, and further comprising:
   a first printed circuit board section;
   a second printed circuit board section; and a flexible connector, wherein the first printed circuit board section is coupled to the second printed circuit board section via the flexible connector, wherein at least one of: a central processing unit, analog to digital converter, and DC to DC converter is disposed on the printed circuit board;

a memory coupled to the printed circuit board; and a disable component comprising a code stored within the memory;

wherein the processor is configured to disable or enable wireless configurability functions of the wireless relay without disabling or enabling the wireless relay based upon receipt of the code.

9. The wireless relay according to claim 8, wherein the wireless relay is a motor protection relay or a multifunction wireless relay.

\* \* \* \* \*